United States Patent
Berto et al.

(10) Patent No.: US 7,170,165 B2
(45) Date of Patent: Jan. 30, 2007

(54) CIRCUIT BOARD ASSEMBLY WITH A BRACE SURROUNDING A BALL-GRID ARRAY DEVICE

(75) Inventors: Thomas E. Berto, Santa Rosa, CA (US); Anirudh N. Vaze, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 103 days.

(21) Appl. No.: 11/049,474

(22) Filed: Feb. 2, 2005

(65) Prior Publication Data
US 2006/0171129 A1  Aug. 3, 2006

(51) Int. Cl.
H05K 7/02 (2006.01)
H05K 1/02 (2006.01)
H05K 7/20 (2006.01)

(52) U.S. Cl. .............................. 257/718; 257/E23.086; 257/E23.084; 257/E23.09; 257/719; 257/720; 257/712; 257/71; 257/726; 257/727; 257/706; 257/707; 257/710; 361/760; 361/785; 361/719; 165/185; 165/80.3; 439/264; 439/68; 439/73

(58) Field of Classification Search ................ 257/727, 257/731–733, 700–703, E23.084, E23.09, 257/E23.086, 717–720, 712, 726, 704, 706, 257/707, 710; 361/760, 785, 697, 703, 708; 165/185, 80.3; 439/68–73, 264
See application file for complete search history.

(56) References Cited

U.S. PATENT DOCUMENTS

| 6,213,787 B1* | 4/2001 | Murphy | 439/71 |
| 6,223,815 B1* | 5/2001 | Shibasaki | 165/185 |
| 6,249,440 B1* | 6/2001 | Affolter | 361/769 |
| 6,252,774 B1* | 6/2001 | Rife | 361/704 |
| 6,400,577 B1* | 6/2002 | Goodwin et al. | 361/816 |
| 6,504,095 B1* | 1/2003 | Hoffstrom | 174/520 |
| 6,614,659 B2* | 9/2003 | Feigenbaum et al. | 361/719 |
| 6,903,271 B2* | 6/2005 | Pearson et al. | 174/548 |
| 7,127,805 B2* | 10/2006 | Watson | 29/827 |
| 2002/0042988 A1* | 4/2002 | Jansson | 29/832 |
| 2002/0162039 A1* | 10/2002 | Kirker et al. | 713/330 |
| 2003/0094692 A1* | 5/2003 | Ho et al. | 257/718 |
| 2004/0178494 A1* | 9/2004 | Lin et al. | 257/704 |
| 2005/0040519 A1* | 2/2005 | Huang et al. | 257/712 |
| 2005/0280140 A1* | 12/2005 | Corbin et al. | 257/706 |
| 2006/0017145 A1* | 1/2006 | Lin et al. | 257/684 |
| 2006/0084254 A1* | 4/2006 | Attarwala | 438/584 |

OTHER PUBLICATIONS

Swiftech, "MCX462-V Heatsink for AMD Processors (Socket Mount)", http://www.swiftnets.com/products/mcx462-V.asp.*
Swiftech, "MCX462-V Heatsink AMD Installation Guide", Sep. 11, 2002, http://www.swiftnets.com/products/MCX462-V-installation-guide.pdf.*
AMD, "AMD Thermal, Mechanical, and Chassis Cooling Design Guide", Nov. 2002, p. 3 http://www.amd.com/us-en/assets/content_type/white_papers_and_tech_docs/23794.pdf.*

* cited by examiner

Primary Examiner—Alexander Oscar Williams

(57) ABSTRACT

An assembly includes a circuit board with a ball grid array device attached to a first side of the circuit board. A brace surrounding the ball grid array device has a series of mounting holes and a series of members extending between the mounting holes. The brace is removably secured to the first side of the circuit board at the mounting holes.

20 Claims, 3 Drawing Sheets

CIRCUIT BOARD ASSEMBLY WITH A BRACE SURROUNDING A BALL-GRID ARRAY DEVICE

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

Printed circuit assemblies ("PCAs") are used in many types of electronic products. A PCA typically has several electronic components mounted on a printed circuit board ("PCB"), which is also often referred to as a printed wiring board. The types of electronic components used in PCAs include individual components, such as packaged capacitors, chip capacitors, inductors, individually packaged transistors, integrated circuits ("ICs"), and many others.

The electronic components are usually soldered to the PCB, which provides secure mechanical and electrical connections. Metal layers on the printed circuit board are patterned to interconnect the electronic components to each other and to interfaces, such as sockets, plugs, and cables, which are then connected to other PCAs or other devices. Some components have leads that extend into plated holes in the circuit board, which are then soldered in place. Using soldered leads is particularly desirable for components that undergo high stress loads, such as plugs, sockets, and large ICs.

Many large ICs are packaged in lead-frames that have leads around the perimeter of the device. The leads are soldered to corresponding solder pads or inserted into corresponding plated holes of the printed circuit board and soldered in place. The leads are relatively compliant and reduce the stress loads on the solder joints arising from shock and vibration of the PCA. However, perimeter leads limit the placement of connections on the PCB, and frequently of the IC, to the perimeter of the device. Similarly, the number of leads around the perimeter of a device increases in proportion to the perimeter, whereas the functionality of the IC, and hence the need for additional connections, often increases as the square of the device area.

Ball-grid array ("BGA")-type ICs, which will be referred to as simply "BGAs," have an array of solder balls on the bottom of an IC, which provide electrical connections to the IC. The solder balls on the bottom of BGA are aligned with corresponding solder pads or solder bumps on a PCB, and the solder balls are reflowed. BGAs are desirable because they can provide a very large number of electrical connections to the IC, and the number of connections scales with the area of the IC. BGAs are also desirable because electrical connections can be made to the interior of the IC without having to come through the perimeter of the IC, which simplifies trace routing in many IC designs.

However, the solder balls are relatively short, stiff, and weak compared to the perimeter leads used with other packaged ICs, such as quad packs and dual in-line packages ("DIPs"). Even though there are usually many solder balls in a BGA device, solder joint may fail in some instances. In particular, if a PCB with a BGA device is subjected to large shock loads, vibration, or distortion (such as twisting or relative contraction/expansion of the printed circuit board due to thermal or mechanical stress), a reflowed solder ball might crack or detach from the BGA or the PCB, causing an open circuit. All the reflowed solder ball connections have failed in some cases, and the BGA has detached from the PCB.

Various techniques have been used to try and improve the reliability of BGAs mounted on PCAs. One approach is to add adhesive under the BGA after it is attached to a PCB. The adhesive is typically applied in a fluid state and cured by heating to a temperature below the melting point of the BGA solder. While the adhesive adds strength to the BGA-PCB bond, the adhesive is not very stiff or strong. Application of the adhesive is relatively messy and subject to process variations. Rework (i.e. removing the BGA and the cured adhesive from the PCB and replacing the BGA) is time-consuming, and in many instances is not possible.

Another approach is to pre-load the BGA with stress in a selected direction by securing the BGA to an external brace, such as a pedestal that is cast or machined into a metal shield, or a tab or flap folded out of a sheet metal brace. A gap pad is typically installed between the pedestal and the BGA to help conduct heat away from the BGA. Most vibration loads will not exceed the preload force, and so the BGA will not lift off of the external brace in vibration. However, this approach uses a stiff structure spanning the PCA, which is itself stiff, adding weight, cost, thickness, and complexity to the overall assembly. Additionally, this method does not guard against heavy shock loads, such as an end-use type pulse (e.g. 125 G's, 2 msec, half-sine), since the amount of preload that is required to protect against this type of shock may cause unacceptable board deflection.

Another approach as been to reduce the span of a PCB by providing machined or cast shields. For example, a shield has walls surrounding a BGA that are attached to the PCB with screws. Alternatively, a shield on one side of the PCB is attached to a shield on the opposite side of the PCB. The shield walls reduce the span over which the PCB can deflect, decreasing stress on the solder joints of the BGA. However, the shields add mass, cost, complexity, and thickness to the total assembly, and the walls of the shield(s) take up area on one or both outside layers of the PCB. The walls of the shield generally extend along an outer surface of the PCB, which affects the electrical characteristics of surface traces (i.e. traces in the first metal layer of the PCB) that pass beneath the wall. This reduces the amount of first metal layer area available for trace routing, and complicates routing signals beneath the walls of the shield.

Therefore, techniques for reducing the bending stress at BGAs on PCBs that avoid the problems discussed above are desirable.

BRIEF SUMMARY OF THE INVENTION

An assembly includes a circuit board with a ball grid array device attached to a first side of the circuit board. A brace surrounding the ball grid array device has a series of mounting holes and a series of members extending between the mounting holes. The brace is removably secured to the first side of the circuit board at the mounting holes.

DETAILED DESCRIPTION OF THE EMBODIMENTS

Figure 1A:
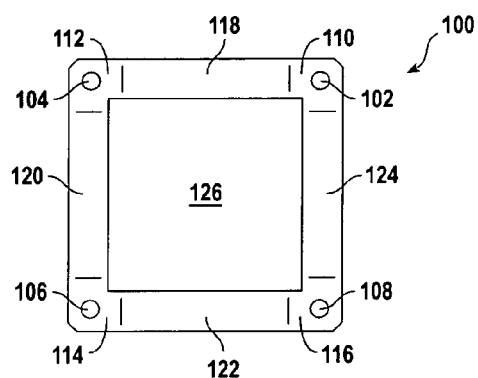
FIG. 1A is a plan view of a brace according to an embodiment of the invention.

FIG. 1A is a plan view of a brace 100 according to an embodiment of the invention. The brace 100 has mounting holes 102, 104, 106, 108 in the corner portions 110, 112, 114, 116 of the brace 100 and raised members 118, 120, 122, 124 connecting the corner portions.

The brace 100 is stamped and coined from aluminum sheet, stainless steel sheet, or other stiff, tough material (relative to a PCB). Stamping and coining metal sheet is particularly desirable because it produces simple, low-cost braces. Additionally, deformation of the sheet metal resulting from the coining step further strengthens the metal. Coining also produces a stamped part with high dimensional and angular precision, which is particularly desirable for use on complex PCBs with high dimensional tolerances, although coining uses presses that produce greater tonnage than those used for free-bending similar material. Alternatively, braces are stamped from sheet metal and formed using free-bending or three-point bending techniques.

The corner portions 110, 112, 114, 116 and the raised members 118, 120, 122, 124 define an aperture 126 having a shape essentially matching the form of a BGA (not shown) that the brace 100 is intended to be used with. For example, a brace for use with a square BGA has a square aperture and a brace for use with a rectangular BGA has a rectangular aperture. When the brace 100 is mounted to a PCB/PCA (see, e.g., FIGS. 3A–3C, 7, and 8), the corner portions 110, 112, 114, 116 are secured to a surface of the PCB, such as with screws extending through the PCB to nuts on the opposite, or to a threaded brace or other threaded device. The raised members 118, 120, 122, 124 are positioned a selected height above the surface of the PCB, which allows routing surface traces, and in some embodiments mounting components, underneath a raised member. Raising the members also improves the stiffness of an assembly (see, e.g., FIGS. 3A–3C, 7, and 8) incorporating the brace because it moves the member further away from the PCB, thus increasing the moment of inertia of the structural cross section.

In a particular embodiment the bottom of a member is 1.4 mm above the PCB to allow mounting transistors, which are typically 1.05 to 1.15 mm high, and capacitors, which are typically about 1.1 mm to 1.2 mm high, underneath the member. It is often desirable to mount capacitors, such as blocking capacitors, next to a BGA. A height of 1.4 mm underneath a member allows mounting a 1.2 mm capacitor under the member with a manufacturing tolerance of 0.2 mm to allow for variation in the machining or coining operation.

Figure 1B:
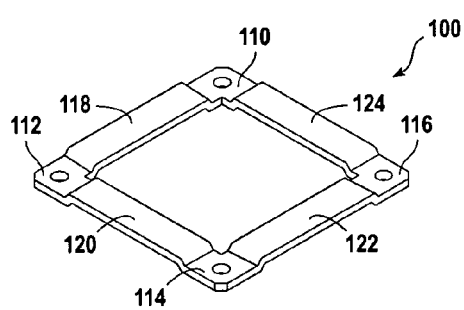
FIG. 1B is an isometric top view of the brace of FIG. 1A.

FIG. 1B is an isometric top view of the brace 100 of FIG. 1A. The raised members 118, 120, 122, 124 are all approximately the same height relative to the corner portions 110, 112, 114, 116. Alternatively, raised members are not all the same height. In some embodiments, one or more members essentially lie on the top surface of a PCB. The term "top" surface is arbitrarily chosen for purposes of convenient discussion to refer to the surface of the PCB that a BGA is mounted on. The opposite surface of the PCB will be referred to as the "bottom" surface, although these terms do not indicate how the PCB is eventually oriented in use.

Figure 2A:
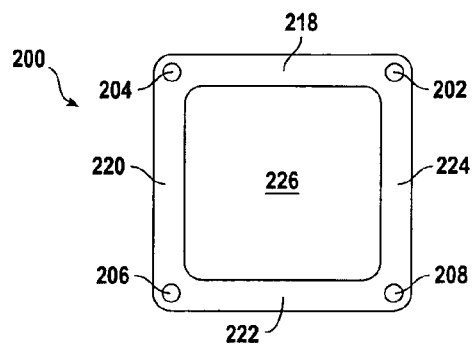
FIG. 2A is a plan view of a brace according to another embodiment of the invention.

FIG. 2A is a plan view of a brace 200 according to another embodiment of the invention. The brace 200 has mounting holes 202, 204, 206, 208 in the corners of the brace 200 and raised members 218, 220, 222, 224 extending between the corners. The brace defines an aperture 226 configured to surround a BGA device (not shown) when the brace is secured to a PCB (not shown) on which the BGA device is attached. The brace 200 is machined, cast, sintered, or similarly formed from stiff, tough material, such as metal, ceramic, cermet, or composite materials. Such techniques, some of which use starting material in a fluid or powered state, allow brace materials and shapes that are not obtainable using sheet metal stamping techniques.

Figure 2B:
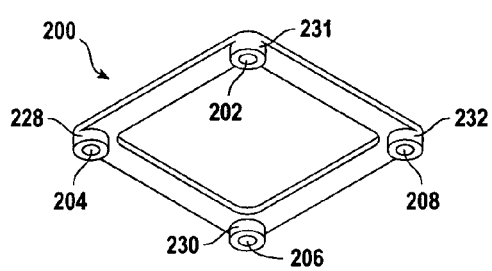
FIG. 2B is an isometric bottom view of the brace of FIG. 2A.

FIG. 2B is an isometric bottom view of the brace 200 of FIG. 2A. The mounting holes 202, 204, 206, 208 extend through legs 228, 230, 231, 232 in the corners of the brace 200. The legs 228, 230, 231, 232 keep the raised members 218, 220, 222, 224 above the top surface of the PCB. In alternative embodiments, additional mounting holes and legs are placed between the corners along a member.

The raised members 218, 220, 222, 224 have the same thickness and are raised to the same height above a PCB (not shown). Alternatively, raised members have different heights and thicknesses. In a particular embodiment, opposite raised members (e.g. member 218 and member 222) are thicker than the other members (e.g. member 220 and member 224). For example, the thicker raised members run along an axis of a PCB that is more prone to deflection, such as a long axis of a PCB or along an axis that is likely to have more curvature during loading. Reducing the stress through the BGA device during shock loading is particularly desirable because solder, which is typically used to attach the BGA to the PCB and can cold-flow in response to static stress, does not substantially flow in response to shock stress.

Figure 2C:
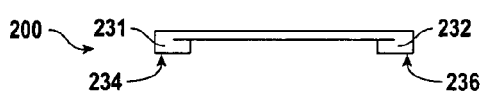
FIG. 2C is a side view of the brace of FIG. 2A.

FIG. 2C is a side view of the brace 200 of FIG. 2A. Bottom surfaces 234, 236 of the legs 231, 232 contact a surface of a PCB (not shown) when the brace 200 is attached to the PCB in a PCA (not shown).

Figure 3A:
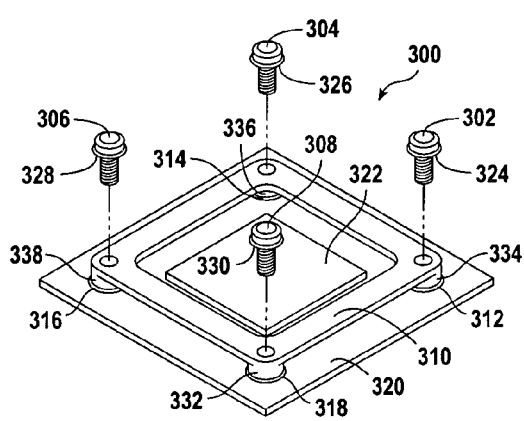
FIG. 3A is an isometric partially exploded view of an assembly according to yet another embodiment of the invention having screws extending through a brace and a PCB.

FIG. 3A is an isometric partially exploded view of an assembly 300 according to yet another embodiment of the invention having screws 302, 304, 306, 308 extending through a brace 310 and secured in threaded inserts 312, 314, 316, 318 of a PCB 320. Alternatively, threaded inserts are omitted and the screws 302, 304, 306, 308 are secured with nuts (not shown) or a second brace on the opposite side of the PCB 320 (see FIG. 3C). A BGA device 322 is surrounded by the brace 310. Attaching a brace that surrounds a BGA device to a PCB regionally stiffens the PCA in the vicinity of the BGA device to re-direct stress that would otherwise arise in the BGA device area (i.e. the area generally between the BGA device and the PCB, particularly in the region where the solder joints between the BGA device and PCB occur) around the BGA device area, and through the brace and other portions of the PCB.

Washers 324, 326, 328, 330, such as plain washers, Belleville washers, or split-ring washers are optionally used. The brace 310 is removably secured to the PCB 320 and locally stiffens the assembly 300 to protect the BGA device 322 and the solder bonds (not shown) securing the BGA device 322 to the PCB 320 from shock, vibration, handling, or other stresses that bend the PCA. Attaching the brace 310 to the PCB 320 with screws provides a secure mechanical coupling of the legs 332, 334, 336, 338 to the PCB 320 that allows easy removal of the brace 310 for re-work of the assembly, such as removing and replacing the BGA device 322. Attaching the brace 310 at its legs 332, 334, 336, 338 minimizes the area of the PCB 320 used, compared to a shield, for example, which is typically soldered to the PCB around its entire perimeter. Reducing the area needed to attach the brace to the PCB is desirable because it leaves more room on the PCB for placing components and routing traces.

Figure 3B:
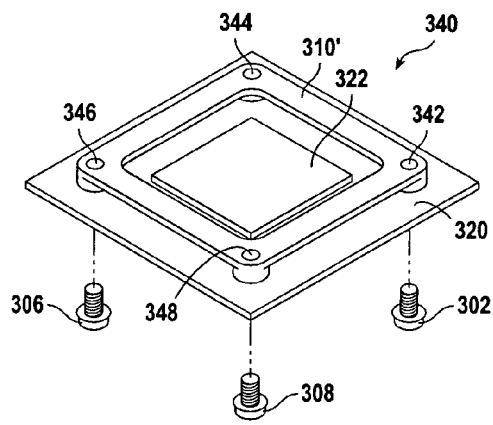
FIG. 3B is an isometric partially exploded view of an assembly according to yet another embodiment of the invention having screws extending through a PCB and secured in a threaded brace.

FIG. 3B is an isometric partially exploded view of an assembly 340 according to yet another embodiment of the invention having screws 302, 306, 308 (a fourth screw is not shown) extending through a PCB 320 and secured in a threaded brace 310'. The threaded brace 310' has threaded mounting holes 342, 344, 346, 348 that cooperate with the screws to removably secure the threaded brace 310' to the PCB 320. When secured to the PCB 320, the threaded brace 310' locally stiffens the assembly 340, protecting the BGA device 322, and the solder bonds (not shown) securing the BGA device 322 to the PCB 320, from shock, vibration, or handling stresses. The brace is removable to allow re-work of the assembly, such as removing and replacing the BGA device 322.

Figure 3C:
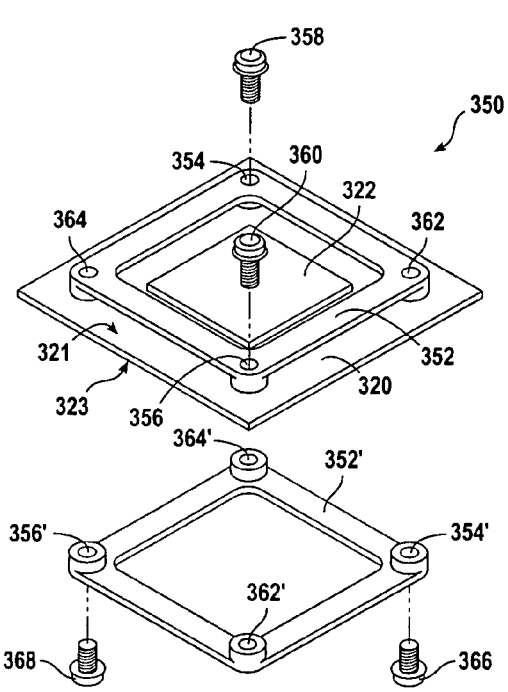
FIG. 3C is an isometric partially exploded view of an assembly according to yet another embodiment of the invention having identical braces on opposite members of a PCB.

FIG. 3C is an isometric partially exploded view of an assembly 350 according to yet another embodiment of the invention having identical braces 352, 352' on opposite members of a PCB 320. A BGA device 322 is attached to a first ("top") side 321 of the PCB 320 and lies within an aperture (see FIG. 2A, ref. num. 226) formed by the brace 352. The brace 352 on the first side 321 of the PCB 320 has plain holes 354, 356 in diagonally opposite corners that screws 358, 360 extend through. The brace 352 also has threaded holes 362, 364 in opposite corners that screws 366, 368 from a second ("bottom") side 323 of the PCB 320 are screwed into.

The brace 352' on the bottom side 323 of the PCB also has plain holes 354', 356' in opposite corners that the screws 366, 368 extend through, and threaded holes 362', 364' that the screws 358, 360 from the top side 321 are screwed into to secure the braces 352, 352' to the PCB 320. The symmetry of the braces 352, 352' allow the same part (brace) to be used on both sides of the PCB 320. Alternatively, the threaded holes are not diagonally opposite each other, but are at opposite ends of a member (i.e. along an edge of the brace), as are the through holes on the opposite edge of the brace. Such a brace also has symmetry allowing a single part to be used on both sides of the PCB. In yet another embodiment, identical braces having four through holes are used on both the top and bottom, and nuts are used to secure the screws. In alternative embodiments, the brace on the bottom side of a PCB is different from that on the top side. For example, the brace on the bottom side has thinner members that cooperate with the PCB and top-side brace to form a structure wherein the neutral plane is positioned to improve reliability of the solder joints attaching the BGA device to the PCB.

Having braces on both sides of a PCB is desirable because the braces form a stiff, box-like structure with the BGA solder joints within the box-like structure. The box-like structure diverts bending stress in a PCB around the BGA device and away from the plane of the BGA solder joints. Alternative embodiments omit a second (bottom-side) brace. A single, top-side brace also forms a box-like structure, in this instance with the PCB, and diverts bending stress in the PCB around the BGA and away from the plane of the BGA solder joints, which are between the top side of the PCB and the raised members of the brace.

Figure 4A:
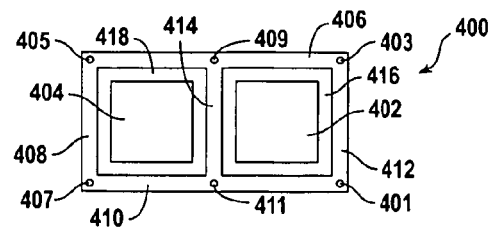
FIG. 4A is a plan view of a brace accommodating two BGAs according to an embodiment of the invention.

FIG. 4A is a plan view of a brace 400 accommodating two BGA devices 402, 404 according to an embodiment of the invention. The BGA devices 402, 404 are not part of the brace, but are shown for purposes of discussion. The brace 400 has four perimeter members 406, 408, 410, 412 and an interior member 414 between perimeter members 406, 410. The interior member 414 and perimeter members define two apertures 416, 418, one for a first BGA device 402, and one for a second BGA device 404. Alternatively, each aperture is differently shaped and/or differently sized.

The perimeter members 406, 408, 410, 412 and the interior member 414 are raised members, allowing surface traces to be routed beneath the raised members and/or allow components to be mounted on a PCB beneath the raised members. Raised members are also desirable because they move the stress through them further away from the plane of the BGA solder joints. Alternatively, one or more members are not raised.

The brace 400 has four corner mounting holes 401, 403, 405, 407 for mounting the brace 400 to a PCB (not shown, see, e.g., FIG. 3A, ref. num. 320). Legs (not shown, see FIG. 3A, ref. nums. 332, 334, 336, 338) are associated with each corner mounting hole to raise the members 406, 408, 410, 412 off the surface of the PCB, improving stiffness of the brace-PCB assembly and allowing component mounting and surface trace routing on the PCB beneath the raised members. Optional side mounting holes 409, 411 with associated legs (not shown) further secure the members 406, 410 to the PCB. Side mounting holes are further discussed below, in light of FIGS. 6B–6D.

Figure 4B:
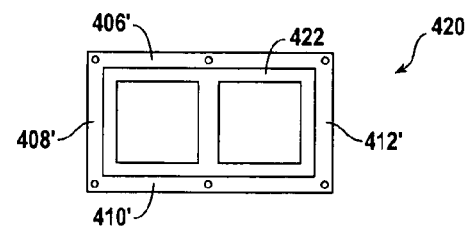
FIG. 4B is a plan view of a brace accommodating two BGAs according to another embodiment of the invention.

FIG. 4B is a plan view of a brace 420 accommodating two BGAs according to another embodiment of the invention.

Perimeter members 406', 408', 410', 412' form a single aperture 422. The aperture 422 accommodates two BGA devices of the type that would fit in the aperture 418 of the brace 400 shown in FIG. 4A; however, the side-by-side configuration of BGA devices in the aperture 422 without an intermediate stiffening structure allows closer spacing of the BGA devices. Additional electronic components, such as chip resistors, capacitors, transistors, or diodes, are optionally located within the aperture 422.

Figure 4C:
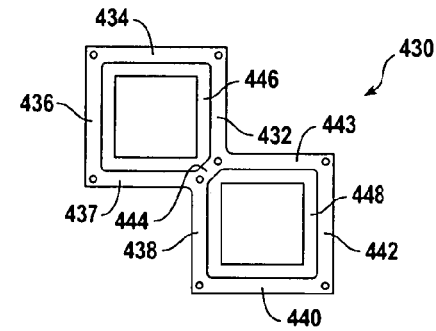
FIG. 4C is a plan view of a brace accommodating two BGAs according to yet another embodiment of the invention.

FIG. 4C is a plan view of a brace 430 accommodating two BGAs according to yet another embodiment of the invention. Perimeter members 432, 434, 436, 437, 438, 440, 442, 443 and an intermediate member 444 define two apertures 446, 448. The two apertures 446, 448 lie along a diagonal in a "figure-8" configuration that is particularly desirable for protecting closely spaced BGA devices that do not provide sufficient room for two separate braces. Similarly, using one brace to protect more than one BGA device reduces the part count on a PCA, compared to using a separate brace for each BGA device. Alternatively, each aperture is differently shaped and/or differently sized.

Figure 5A:
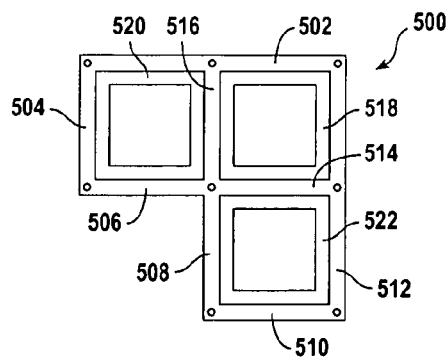
FIG. 5A is a plan view of a brace accommodating three BGAs according to an embodiment of the invention.

FIG. 5A is a plan view of a brace 500 accommodating three BGAs according to another embodiment of the invention. Perimeter members 502, 504, 506, 508, 510, 512 and intermediate members 514, 516 define three apertures 518, 520, 522, each of which surrounds a BGA device when incorporated in a PCA. The perimeter members and intermediate members are raised members. Alternatively, one or more of the members is not raised. In other embodiments, each aperture is differently shaped and/or differently sized.

Figure 5B:
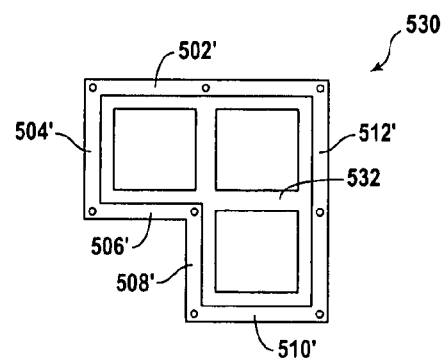
FIG. 5B is a plan view of a brace accommodating three BGAs according to another embodiment of the invention.

FIG. 5B is a plan view of a brace 530 accommodating three BGAs according to an embodiment of the invention. Perimeter members 502', 504', 506', 508', 510', 512' define an aperture 532 that can accommodate three BGA devices such as would be used in the apertures 518, 520, 522 in the brace 530 of FIG. 5A. The BGA devices may be spaced closer together in the aperture 532 of the brace 530 of FIG. 5B because no intermediate members take up area within the aperture 532. Alternatively the "legs" of the brace 530 are not of equal length and/or width so as to accommodate BGA devices of various sizes.

Figure 6A:
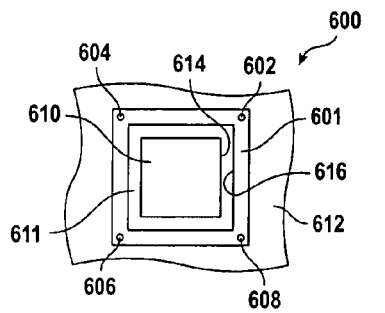
FIG. 6A is a plan view of a brace with corner holes according to an embodiment of the invention.

FIG. 6A is a plan view of a PCA 600 with a brace 601 having corner holes 602, 604, 606, 608 according to an embodiment of the invention. The brace 601 and a BGA device 610 are mounted on a PCB 612. The screws attaching the brace 601 to the PCB 612 are omitted for simplicity of illustration. The BGA device 610 is within an aperture 611 formed by the brace 601. An edge 614 of the BGA device 610 is set back a selected distance from an inner edge 616 of the brace 601.

The distance is selected so as to insure that stresses in the PCA 600, such as stresses arising from vibration, shock, or handling, do not extend under the brace 601 into the aperture 611 so as to cause solder joints between the BGA device 610 and PCB 612 to fail. In a particular embodiment, a BGA device is 25 mm by 25 mm and the aperture formed by a brace is 27 mm by 27 mm. The set-back between the BGA device and the inner edges of the brace is 1 mm on all sides. Alternatively, the set-back is not equal on all sides. The desired set back is selected according to the span of members, stiffness of the members, thickness of the PCB, and the nature and number of the solder joints between the BGA device and PCB, among other factors.

Generally, the set back is selected so as to provide enhanced reliability of the solder joints between a BGA device and a PCB when a PCA is mechanically stressed under expected (design) loading. Particular embodiments have set-backs ranging from about 1 mm to about 9 mm. The appropriate set-back depends on several factors, such as board thickness, brace size, brace material, brace thickness, and the size of the BGA device. A set-back of between about 5 mm and about 7 mm is particularly desirable in some embodiments, such as with relatively large PCB assemblies, and most particularly with PCBs about 1.6 mm thick.

Figure 6B:
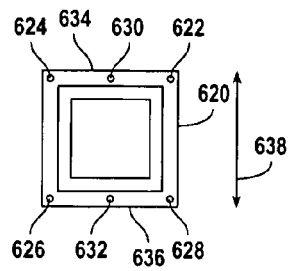
FIG. 6B is a plan view of a brace with corner holes and with side holes according to an embodiment of the invention.

FIG. 6B is a plan view of a brace 620 with corner holes 622, 624, 626, 628 and with side mounting holes 630, 632 according to an embodiment of the invention. Thus, two opposite members 634, 636 have three holes 622, 630, 624; 626, 632, 628. The side mounting holes 630, 632 have been added along the members 634, 636 perpendicular to the axis of the PCA having the most curvature when stressed during shock, vibration, or handling of the PCA. The axis having the most curvature when stressed is frequently the long axis of a PCA, which is represented by a double-ended arrow 638. The side mounting holes 630, 632 secure the centers of the sides 634, 636 of the brace 620 to a PCB (not shown), further stiffening the brace-PCB assembly. A PCA having a brace and BGA device with a 5 mm set back was modeled. Adding a side mounting hole in a member of the brace perpendicular to the long axis of the PCB reduced the maximum stress to about half the maximum stress of the PCA modeled with a side hole in a member of the brace parallel to the long axis of the PCB. The difference in maximum stress between braces with side mounting holes in members perpendicular to the long axis of a PCB and braces with side mounting holes in members parallel to the long axis of a PCB becomes more pronounced with less offset. Thus, it is particularly desirable to include side mounting holes in members of a brace perpendicular with the axis of the PCA likely to have the most curvature when stressed when the offset is less than 5 mm.

Figure 6C:
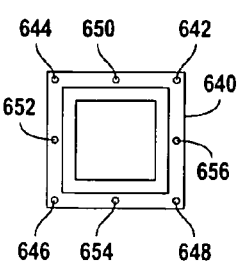
FIG. 6C is a plan view of a brace with corner holes and with side holes according to another embodiment of the invention.

FIG. 6C is a plan view of a brace 640 with corner holes 642, 644, 646, 648 and with side mounting holes 650, 652, 654, 656 according to another embodiment of the invention. Additional mounting holes are desirable to improve stiffness and redirect stress, but the number of side mounting holes is balanced with the need to use surface area on the PCB (not shown) for other purposes, such as trace routing and electronic component mounting.

Figure 6D:
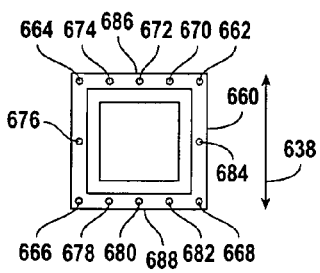
FIG. 6D is a plan view of a brace with corner holes and with side holes according to yet another embodiment.

FIG. 6D is a plan view of a brace 660 with corner holes 662, 664, 666, 668 and with side mounting holes 670, 672, 674, 676, 678, 680, 680, 682, 684 according to yet another embodiment. The members 686, 688 having the most mounting holes are perpendicular to the axis of a PCA likely to have the most curvature when stressed, represented by the double-ended arrow 638.

Figure 7:
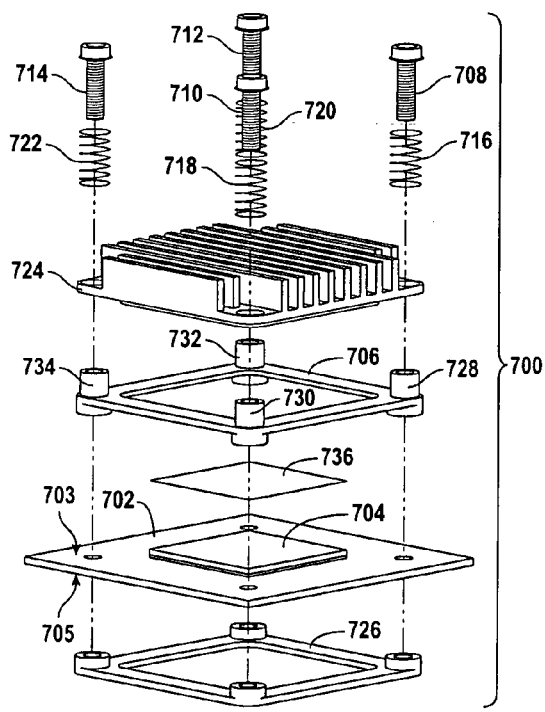
FIG. 7 is an isometric exploded view of an assembly according to an embodiment of the invention.

FIG. 7 is an isometric exploded view of an assembly 700 according to an embodiment of the invention. The assembly 700 is a portion of a PCA that includes a PCB 702 with a BGA device 704 attached (e.g. soldered) to the PCB 702. A brace 706 stiffens the assembly 700 when the brace 706 is secured to the assembly with screws 708, 710, 712, 714. The screws 708, 710, 712, 714 extend through springs 716, 718, 720, 722, a heat sink 724, the PCB 702 to a second brace 726 threaded to accept the screws so as to removably secure the brace 706 to a first ("top") side 703 of the PCB 702 and to secure the second brace 726 to a second ("bottom") side 705 of the PCB 702. Alternatively, the second brace 726 is omitted and separate nuts (not shown) cooperate with the screws 708, 710, 712, 714 to secure the brace 706 and heat sink 724 to the PCB 702. In another embodiment, the PCB has threaded inserts (not shown) that the screws 708, 710, 712, 714 cooperate with to secure the brace 706 and heat sink 724 to the PCB.

The brace 706 includes pedestals 728, 730, 732, 734 that limit the travel of the screws 708, 710, 712, 714 and springs 716, 718, 720, 722 that press the heat sink 724 against the BGA device 704 through a gap pad 736. The gap pad is a pad of thermally conductive compliant material that improves heat transfer between the BGA device 704 and the heat sink 724 in addition to evenly distributing the pressure. Alternatively, pedestals are not integrated into the brace, and separate tubular standoffs are used with a brace, such as one in accordance with FIG. 2B or FIG. 1B.

In other words, when assembled, the screws 708, 710, 712, 714 stop against the pedestals 728, 730, 732, 734, and the springs 716, 718, 720, 722 push the heat sink 724 against the gap pad 736 and BGA device 704. The springs allow for assembly variations in the height of the BGA device above the PCB, and the dimensions of the brace and the heat sink. The brace keeps the PCB underneath the BGA flat, which limits solder ball stress. In an alternative embodiment, thermally conductive grease is applied between the BGA device and the heat sink. Thermally conductive grease provides good thermal coupling between the BGA device and the heat sink while mechanically decoupling the BGA device from the heat sink.

Figure 8:
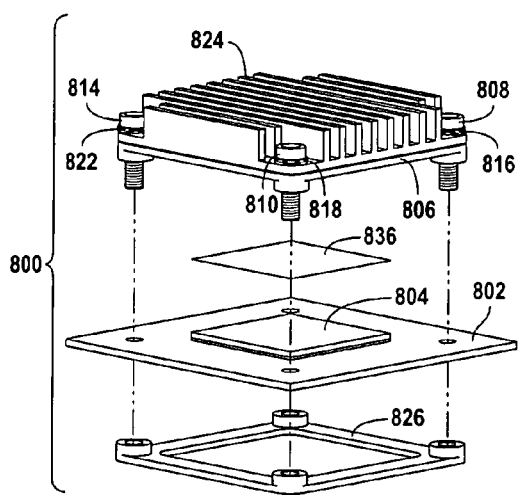
FIG. 8 is an isometric exploded view of an assembly according to another embodiment of the invention.

FIG. 8 is an isometric exploded view of an assembly 800 according to another embodiment of the invention. The assembly 800 is a portion of a PCA that includes a PCB 802 with a BGA device 804 attached (e.g. soldered) to the PCB 802. A brace 806 stiffens the assembly 800 when the brace 806 is secured to the assembly with shoulder screws 808, 810, 814 (a fourth shoulder screw is not shown in this view). Shoulder screws have a plain (unthreaded) region of larger diameter than the threads. The shoulder screws 808, 810, 814 extend through springs 816, 818, 822 (a fourth spring is present but not shown in this view), which are compressed by the shoulder screws against a heat sink 824. In one embodiment, the shoulder screws are captivated in heat sink 824 and the heat sink 824, springs 816, 818, 822, and captivated shoulder screws 808, 810, 814 form a subassembly that is conveniently installed onto the PCB. A second brace 826 is threaded to accept the screws. Alternatively, the second brace 826 is omitted and nuts (not shown) cooperate with the shoulder screws 808, 810, 814 to secure the brace 806 and heat sink 824 to the PCB 802. In another embodiment, the PCB has threaded inserts (not shown) that the shoulder screws 808, 810, 814 cooperate with to secure the brace 806 and heat sink 824 to the PCB 802.

Braces according to embodiments of the invention locally stiffen a PCA around a BGA device, protecting the solder joints securing the BGA device to the PCA, and also protecting the BGA device from cracking in some applications. Curvature of the PCB within the brace when stress is applied is reduced, compared to the curvature that the PCB in this region would exhibit if the brace were omitted. Analytical simulations show that the stress inside a brace is a small percentage of that which would occur without the brace.

Various PCA models were evaluated using MECHANICA™ software, available from PARAMETRIC TECHNOLOGY CORPORATION of Needham, Mass. All models assumed a standard PCB and a brace made of 6061 aluminum alloy having members 1.59 mm thick with legs extending an additional 1.59 mm to the PCB, substantially in accordance with the brace 200 shown in FIG. 2A. The PCB is also about 1.59 mm thick. In other words, the top of the brace was 3.18 mm from the surface of the PCB, and the legs provided 1.59 mm of clearance between the surface of the PCB and the underside of the members of the brace. In alternative embodiments, the top of the brace is raised further from the surface of the PCB, increasing stiffness of the PCA in the vicinity of the BGA device. Alternatively, the thickness of the members of the brace is increased. The BGA device was assumed to be 25 mm by 25 mm in all cases.

In one set of simulations, the aperture formed by the brace was 27 mm by 27 mm, and the outer dimensions of the brace were 42 mm by 42 mm. Load in these simulations was 60 N, applied normal to and distributed uniformly on the face of the BGA. A PCA without any brace has a maximum stress of 45 mega-Pascals ("MPa") through a portion of the BGA device under this load. The same PCA with a brace on the side of the PCA having the BGA device has a maximum stress of 15 MPa through the BGA device. The same PCA with identical braces on both members of the PCA (see, e.g., FIG. 5C) has a maximum of 8.3 MPa stress, which is about 18% of the stress without the braces. By increasing the size of the aperture to 35 mm by 35 mm (i.e. a 5 mm set back), the maximum stress through the BGA device was reduced to 6% of the un-braced PCA.

Additional simulations were performed with this load, and are summarized in the following table:

TABLE 1

| Type | Peak Stress (MPa) | Typ. Stress (MPa) | Relative Peak Stress | Relative Typical Stress |
| --- | --- | --- | --- | --- |
| No Brace | 82 | 44 | 1.0 | 1.0 |
| Single Brace (FIG. 2A) 27 mm × 39 mm | 30 | 15 | .37 | .34 |
| Double Brace FIG. 2A 27 mm × 39 mm | 26 | 8.3 | .32 | .19 |
| Double Brace FIG. 2A 35 mm × 47 mm | 21 | 10.0 | .26 | .23 |
| Double Brace FIG. 1A 27 × 42 1.6 mm thick Al | 17.4 | 9.0 | .21 | .20 |
| Double Brace FIG. 2A 35 × 47 six mounting holes | 10.4 | 6.6 | .13 | .15 |
| Double Brace FIG. 2A 35 × 47 eight mounting holes | 11 | 5.5 | .13 | .13 |

All of the modeled examples have four mounting holes, one in each corner, except the last two samples (rows), which have six mounting holes (see FIG. 8B) and eight mounting holes (see FIG. 8C).

The same examples modeled in Table 1 were evaluated for a gravity load of 125 G's, simulating an "end-use" type shock. The results are summarized in the following table:

TABLE 2

| Type | Peak Stress (MPa) | Typ. Stress (MPa) | Relative Peak Stress | Relative Typical Stress |
| --- | --- | --- | --- | --- |
| No Brace | 316 | 185 | 1.0 | 1.0 |
| Single Brace (FIG. 2A) 27 mm × 39 mm | 139 | 51 | .44 | .28 |
| Double Brace FIG. 2A 27 mm × 39 mm | 114 | 23 | .36 | .12 |
| Double Brace FIG. 2A 35 mm × 47 mm | 82 | 25 | .26 | .14 |
| Double Brace FIG. 1A 27 × 42 1.6 mm thick Al | 62 | 21 | .20 | .11 |

TABLE 2-continued

| Type | Peak Stress (MPa) | Typ. Stress (MPa) | Relative Peak Stress | Relative Typical Stress |
|---|---|---|---|---|
| Double Brace FIG. 2A 35 × 47 six mounting holes | 35 | 12 | .11 | .06 |
| Double Brace FIG. 2A 35 × 47 eight mounting holes | 41 | 10.5 | .13 | .06 |

Tables 1 and 2 show that handling and shock loads in the BGA device mounting area can be significantly reduced by using embodiments of the invention. The values in Tables 1 and 2 are provided for purposes of illustration, and are merely exemplary.

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. An assembly comprising:
   a circuit board;
   a ball grid array device soldered to a first side of the circuit board; and
   a brace surrounding the ball grid array device having
      a series of mounting holes, and
      a series of members extending between mounting holes, the brace being removably secured to the first side of the circuit board at the mounting holes.

2. The assembly of claim 1 wherein at least one of the members is positioned a selected height above the circuit board.

3. The assembly of claim 2 wherein the selected height is not less than 1.4 mm.

4. The assembly of claim 1 wherein each of the members in the series of members is positioned above the circuit board.

5. The assembly of claim 4 wherein each of the members in the series of members is raised a selected height above the circuit board.

6. The assembly of claim 4 wherein a first member is raised a first selected height above the circuit board and a second member is raised a second selected height above the circuit board.

7. The assembly of claim 1 wherein the brace comprises coined sheet metal having mounting holes extending through corner portions of the coined sheet metal.

8. The assembly of claim 1 wherein an edge of the ball grid array device is set back from an inner edge of the brace.

9. The assembly of claim 8 wherein the edge of the ball grid array device is set back from the inner edge of the brace between about 1 mm and about 9 mm.

10. The assembly of claim 8 further comprising a second ball grid array device surrounded by the brace.

11. The assembly of claim 1 wherein the brace further comprises a side mounting hole.

12. The assembly of claim 11 wherein the side mounting hole is in a member perpendicular to an axis of the circuit board likely to have the most curvature when stressed.

13. The assembly of claim 1 further comprising a second brace removably secured to a second side of the circuit board.

14. The assembly of claim 13 wherein the second brace matches the brace.

15. The assembly of claim 13 wherein the second brace includes at least two threaded mounting holes and at least two through mounting holes.

16. The assembly of claim 15 wherein the two threaded holes are diagonally opposite from each other.

17. The assembly of claim 1 wherein the members define an aperture, and further comprising a heat sink disposed within the aperture and thermally coupled to the ball grid array device.

18. The assembly of claim 17 further comprising
   a plurality of screws extending through each of the corner mounting holes; and
   a plurality of springs disposed so as to press the heat sink toward the ball grid array device.

19. The assembly of claim 1 further comprising
   an intermediate member of the brace; and
   a second ball grid array device attached to the first side of the circuit board and surrounded by the brace, the ball grid array device being separated from the second ball grid array device by the intermediate member.

20. The assembly of claim 19 wherein the brace further comprises side holes.

* * * * *